United States Patent
Abdat (10) Patent No.: US 7,484,063 B2
(45) Date of Patent: *Jan. 27, 2009

(54) SORTING METHOD AND APPARATUS USING A CAM

(75) Inventor: Mourad Abdat, Nepean (CA)

(73) Assignee: MOSAID Technologies, Inc., Kanata, Ontario (CA)

( * ) Notice: Subject to any disclaimer, the term of this patent is extended or adjusted under 35 U.S.C. 154(b) by 28 days.

This patent is subject to a terminal disclaimer.

(21) Appl. No.: 11/582,160

(22) Filed: Oct. 16, 2006

(65) Prior Publication Data

US 2007/0244893 A1    Oct. 18, 2007

Related U.S. Application Data

(63) Continuation of application No. 11/263,144, filed on Oct. 31, 2005, now Pat. No. 7,124,268, which is a continuation of application No. 10/286,743, filed on Oct. 31, 2002, now Pat. No. 6,990,552.

(51) Int. Cl.
*G06F 12/00* (2006.01)
*G06F 7/06* (2006.01)

(52) U.S. Cl. .............................. 711/165; 711/108; 707/7

(58) Field of Classification Search ................. 711/165, 711/108; 707/7
See application file for complete search history.

(56) References Cited

U.S. PATENT DOCUMENTS

| | | | |
|---|---|---|---|
| 4,845,668 A * | 7/1989 | Sano et al. ................ 365/49 |
| 5,218,700 A | 6/1993 | Beechick | |
| 5,396,622 A | 3/1995 | Lee et al. | |
| 5,423,015 A | 6/1995 | Chung | |
| 6,081,440 A * | 6/2000 | Washburn et al. ............. 365/49 |
| 6,199,064 B1 | 3/2001 | Schindler | |
| 6,252,790 B1 | 6/2001 | Shectman | |
| 6,502,163 B1 | 12/2002 | Ramankutty | |
| 6,615,311 B2 | 9/2003 | Ramakrishnan | |
| 6,990,552 B2 * | 1/2006 | Abdat ........................ 711/108 |
| 7,124,268 B2 * | 10/2006 | Abdat ........................ 711/165 |
| 2001/0005876 A1 * | 6/2001 | Srinivasan et al. .......... 711/108 |
| 2002/0161969 A1 * | 10/2002 | Nataraj et al. ............... 711/108 |
| 2003/0007378 A1 | 1/2003 | Regev | |
| 2003/0028713 A1 | 2/2003 | Khanna et al. | |
| 2003/0145178 A1 | 7/2003 | Jiang et al. | |

OTHER PUBLICATIONS

Lines, et al., "66MHz 2.3M Ternary Dynamic Content Addressable Memory," IEEE, 0-7695-0689-5/00, pp. 101-105 (2000).

"Intra-Device Configurability in Network Search Engines," pp. 1-6 (Jan. 2001).

* cited by examiner

*Primary Examiner*—Shane M Thomas
(74) *Attorney, Agent, or Firm*—Hamilton, Brook, Smith & Reynolds, P.C.

(57) ABSTRACT

Method and apparatus for using a Content Addressable Memory for sorting a plurality of data items is presented. The data items to be sorted are stored in the Content Addressable Memory. A plurality of bit-by-bit burst searches are performed on the contents of the Content Addressable Memory with all other bits in the search key masked. The number of burst searches is proportional to the total number of bits in the data items to be sorted. The search is deterministic dependent on the number of bits in each data item on which a sort is performed and on the number of data items to be sorted.

16 Claims, 7 Drawing Sheets

SORTING METHOD AND APPARATUS USING A CAM

RELATED APPLICATION

This application is a continuation of U.S. application Ser. No. 11/263,144, now U.S. Pat. No. 7,124,268 filed Oct. 31, 2005, which was a continuation of U.S. application Ser. No. 10/286,743, now U.S. Pat. No. 6,990,552 filed Oct. 31, 2002. The entire teachings of the above applications are incorporated herein by reference.

BACKGROUND OF THE INVENTION

There are many well-known algorithms implemented in software for sorting data, such as numbers or strings. Relative performance can vary dependent on the initial order of the data to be sorted. Most of the data may be in the correct order, all of the data may be mixed up in random order or the data may be in reverse order.

One well-known algorithm implemented in software is the exchange (bubble) sort algorithm. The exchange sort algorithm is dependent on the order of the data. This algorithm compares adjacent data items and exchanges the order of the data items so that the largest data item "bubbles" through to the end of the list. For n data items, the sort continues until no exchanges are made in a pass through the list or until all data items have been compared (that is, n−1 passes for n data items).

Another well-known sorting algorithm, implemented in software is the selection sort. This algorithm requires n−1 passes to sort a list of n data items. The selection sort searches the list for the data item having the lowest value and swaps the lowest value with the first data item of the list. The algorithm searches the list for the next data item having the next lowest value and swaps it with the data item in the next location. The algorithm continues to swap data items until n−1 passes have been made through the list. The selection sort always requires n−1 passes through the list but requires less exchanges than the bubble sort. The bubble sort performs more exchanges but the number of passes through the list may be less dependent on the distribution of the data. Both the selection and bubble sorts require a sorting time proportional to the square of the number of records.

Some algorithms are efficient with some distributions of the data to be sorted. However, there is no universal algorithm with constant performance over a wide range of conditions and number distributions.

SUMMARY OF THE INVENTION

A method and apparatus for performing a deterministic sort is presented. The performance is independent of the distribution of the data items to be sorted. The same performance in speed is achievable for data items stored in random order, reverse order or any other distribution. In one embodiment, the algorithm uses a 9 Mbit Content Addressable Memory, allowing 64K data items each having 144 bits to be sorted in a few milliseconds. The 9 Mbits can be distributed with different widths and depths without any performance degradation on the sorting algorithm. For example, the same performance can be achieved when sorting 32K data items each having 288 bits or 64K data items each having 144 bits.

The search of the entries in the CAM may be performed starting with the least significant bits and ending with the most significant bits (non-progressive) or starting with the most significant bits and ending with the least significant bits (progressive).

A sorting apparatus includes a Content Addressable Memory which stores entries to be sorted. A first memory stores a copy of the contents of the Content. Addressable Memory. A second memory stores ordered entries read from the first memory using match addresses output in response to a masked one bit burst search command issued to the Content Addressable Memory. The ordered entries stored in the second memory are written back to the Content Addressable Memory to allow further sorting of the entries.

The burst search command may perform a masked M-bit search. A one-bit sort of the entries is performed by issuing a masked one bit burst search command for the bit set to '1' and another masked one bit burst search command for the bit set to '0'. The number of M-bit burst searches to sort a list with precision P is $P/M*2M$.

The first and second memory may be random access memory with one of the random access memories assigned as read memory and the other random access memory assigned as write memory. The assignment of read and write memory alternates on successive sort cycles.

A progressive sort may be performed by issuing a first masked one bit burst search for a least significant bit to the Content Addressable Memory. A non-progressive sort may be performed by issuing a first masked one bit burst search for a most significant bit to the Content Addressable Memory. The average number of Content Addressable Memory cycles to sort N entries of precision P is $(3/2*P*N)$. The number of one bit masked burst searches is proportional to the precision P of the data items to sort (the number of bits in each data item to be sorted). The ordered entries may be in ascending or descending order.

A method of performing a sort may include, in each of successive sort cycles, initiating a burst search of data to be sorted in Content Addressable Memory (CAM), reading data indicated by match addresses identified in the CAM burst search and rewriting the data in a sorted order.

A particular method for performing a sort comprises, in successive sort cycles, duplicating entries to be sorted in Content Addressable Memory and random access memory. A burst search command is issued to Content Addressable Memory. Using match addresses output from Content Addressable Memory in response to the issued burst search command, entries stored in random access memory are copied to Content Addressable Memory to allow further sorting of the entries. The entries are copied to Content Addressable Memory by first copying to random access memory.

The burst search command may perform a masked M-bit search. A one-bit sort of the entries is performed by issuing a masked one bit burst search command for the bit set to '1' and another masked one bit burst search command for the bit set to '0'.

The first and second memory may be random access memory with one of the random access memories assigned as read memory and the other random access memory assigned as write memory. The assignment of read and write memory alternates on successive sort cycles.

A progressive sort may be performed by issuing a first masked one bit burst search for a least significant bit to the Content Addressable Memory. A non-progressive sort may be performed by issuing a first masked one bit burst search for a most significant bit to the Content Addressable Memory. The average number of Content Addressable Memory cycles to sort N entries of precision P is $(3/2*P*N)$. The number of one bit masked burst searches is proportional to the precision P of the data items to sort (the number of bits in each data item to be sorted). The ordered entries may be in ascending or descending order.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
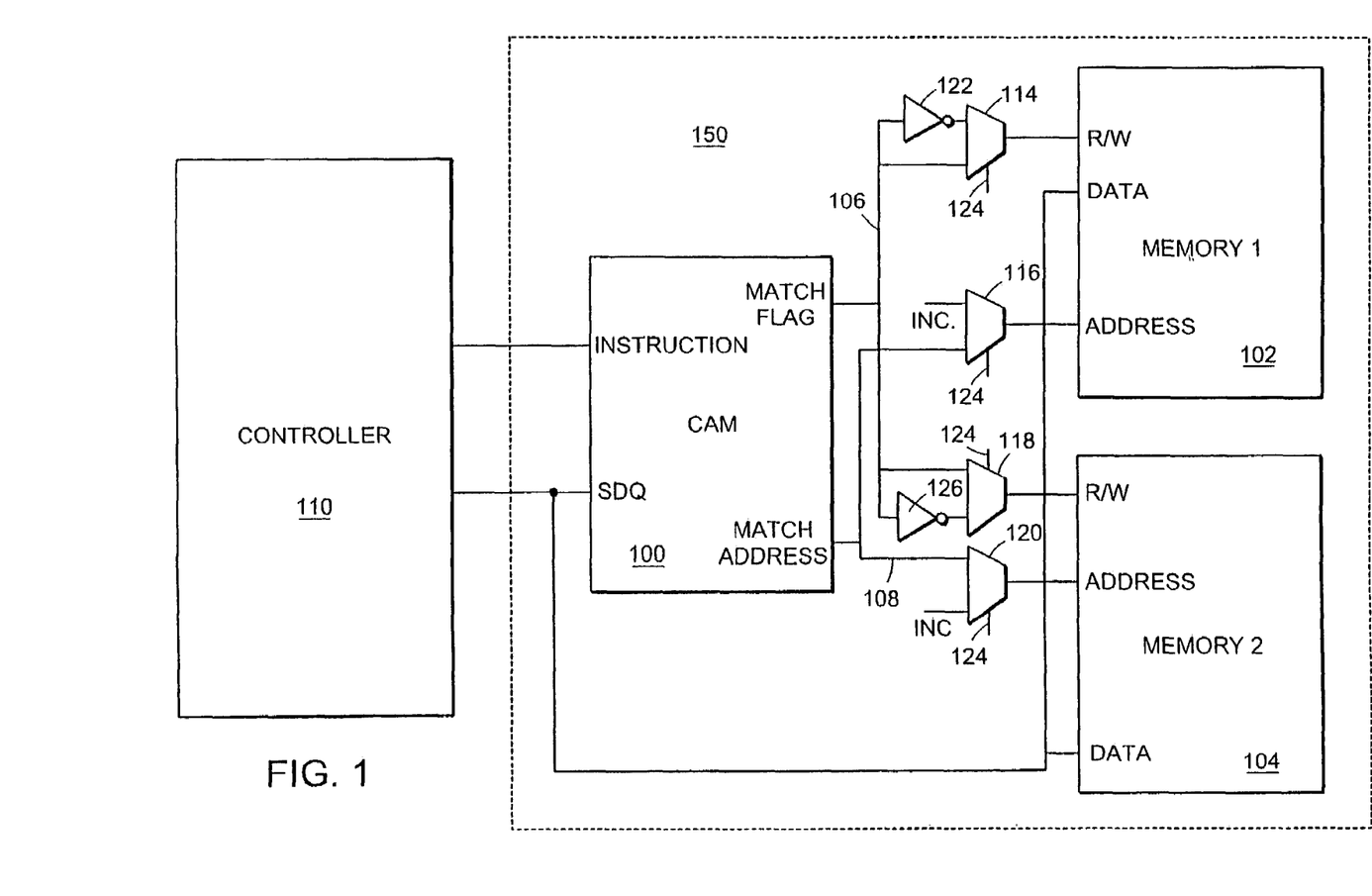
FIG. 1 is a block diagram of an embodiment of the sorting apparatus according to the principles of the present invention.

FIG. 1 is a block diagram of an embodiment of a sorting apparatus 150 according to the principles of the present invention. The sorting apparatus 150 includes a Content Addressable Memory ("CAM") 100 and two read/write memories 102, 104. In one embodiment, the CAM is a Class-ICTM DC9288 9 Megabit Ternary CAM from Mosaid Technologies, Inc., incorporated herein by reference in its entirety. The DC9288 CAM allows bits to be masked in a search key and provides a multiple match output in response to a burst search command (search and output all), both of which are used to perform the sort. However, the invention is not limited to the DC9288. The invention applies to any CAM that provides a multiple match output function and search mask function (allowing bits to be masked in the search key).

As opposed to a conventional memory, in a CAM data is supplied to the memory via a special comparand register. The memory returns an address if a corresponding match is found in the memory. A search of all locations in the CAM is performed in parallel. If a match is found, the match address returned is used to retrieve data associated with the search key. The associated data is typically stored in a separate, discrete memory in a location specified by the result of the CAM search.

The Class-ICTM DC9288 CAM can perform up to 100 million searches per second (one search every 9.1 ns (7 clocks at 110 MHz). The multiple match output performs successive outputs of matching entries in order of priority. A burst search for all entries matching a key is initiated by issuing a "Search and Output All Matching Entries" instruction to the Class-ICTM DC9288 CAM. This instruction corresponds to a "search" instruction followed by "output next matching entry" instructions until the match addresses for all matching entries have been output.

The CAM performs a search operation, outputs the first match address, asserts the match flag and multiple match flag dependent on the number of matching entries. A match flag is asserted when one or more matching entries is found in the search. A multiple match flag is asserted when two or more matching entries are found in the search. If more than one match is found in the memory, the match addresses are sequentially output on subsequent clock cycles in order from highest to lowest priority. The last match address is accompanied by an asserted match flag and de-asserted multiple match flag.

The search mask allows bits in entries or data items stored in the CAM to be ignored during a search operation. For example, a bit-by-bit search can be performed for a selected bit set to '1' or '0'. A burst search command outputs all of the match addresses for data items matching the non-masked bits in the search key. Alternatively, a multi-bit masked search can be performed.

The CAM 100 stores the data items before and after the sort operation. Memories 102, 104 facilitate the sorting of the data items stored in the CAM 100. Each of the memories 102, 104 is the same size as the CAM 100, to allow temporary storage of the entire contents of the CAM.

The entries stored in the CAM are sorted by performing a series of burst searches. No other search instruction can be issued until all matching addresses are output indicated by a de-asserted match flag. The number of burst search commands issued to the CAM is dependent on the number of bits of the data items to be sorted and the number of bits searched with each burst search command. A CAM differs from a memory in that the address of the entry matching a search key, that is, the match address, is returned instead of the data stored at the address. The match address can be used to find data associated with the search key stored in a separate memory in a location specified by the match address.

In one embodiment, a masked one bit burst command is issued to the CAM to search for all data items having the selected bit set to '1' or '0'. One of the burst search commands is issued for the selected bit set to '1' and all other bits masked. A single search is performed in CAM for all matching entries. The CAM asserts the match flag and outputs the addresses of all matching entries in successive clock cycles. The other burst search command is issued for the selected bit set to '0' and all other bits masked. A single search is performed in CAM for all matching entries. All match addresses for the remaining data items having the selected bit set to '0' are output in successive clock cycles. Thus, all data items in the CAM can be sorted with respect to one bit by issuing two consecutive masked one bit burst searches, one for the selected bit set to '1' and the other for the selected bit set to '0'. The two masked one bit burst searches for the selected bit are referred to as a sort cycle.

In order to access the data items associated with each match address, the contents of the CAM 100 are copied to one of the memories 102, 104 before each sort cycle. The roles of the memories are swapped for the next sort cycle. The memory storing the contents of the CAM is referred to as "read" memory. The other memory, referred to as "write" memory, is selected for storing the ordered data items. For example, to sort the data items with respect to a first bit, if memory 102 is selected as "read" memory, a copy of the contents of the CAM is written to memory 102 prior to the start of the sort cycle, and memory 104 is "write" memory for storing the results of the bit.

As shown, the sorting method is implemented by a processor 110 with associated instruction memory 112. The processor 110 issues the burst search commands to the CAM 100 through the instruction input and associated masked search data through the search data (SDQ) input. The issued commands and associated data are based on a sort algorithm stored in instruction memory 112. The sort algorithm keeps track of the number of bits to be sorted and the "read" memory and "write" memory designated for the current sort cycle. In an alternate embodiment, the function of the processor 110 and instruction memory 112 can be implemented in a Field Programmable Gate Array ("FPGA") or an Application Specific Integrated Circuit ("ASIC").

The match flag 106 output from the CAM 100 with each match address provides the read or write control signal to the respective memory 102, 104 through multiplexers 114, 118 and buffers 122, 124. During each sort cycle, the multiplexor control input 124 to multiplexers 114, 116, 118, 120 selects one memory for write access and the other memory for read access. The multiplexor controller input 124 is controlled by the processor 110. The roles of the memories are reversed during the next sort cycle.

The match addresses are used to access the locations to read in the memory designated as 'read' memory. The data items that are read from "read" memory are written to the other memory designated as 'write' memory in sequential memory addresses starting with address '0'. For example, memory 102 is designated "read" memory and memory 104 is designated "write" memory for the sort cycle. For each match address 108 output by the CAM 100, a read is performed in memory 102; that is, the memory storing a copy of the CAM. The data item that is read from memory 102 is written to memory 104 at the next sequential memory address. At the end of the sort cycle, memory 104 stores the newly sorted list based on the selected bit. The newly sorted list stored in memory 104 is written to the CAM 100.

At the start of the next sort cycle, memory 104 stores a copy of the contents of the CAM. When sorting the next bit position in the next sort cycle, the roles of the two memories are switched. Memory 104 is designated "read" memory and memory 102 is designated "write" memory to allow further sorting of the entries stored in the CAM.

After the first pass, all entries with '0' in the least significant bit position will lead those with '1'. Then the next least significant bit position is searched through a mask. Since data within the CAM is already ordered by least significant bit, the second pass will order the data according the two least significant bits. Subsequent passes search single more significant bits to order more finely. The ordered data stored in "write" memory cannot be written back to CAM until all search commands have been issued.

During each sort cycle, the data items sorted in response to the second burst search command issued to the CAM can be written directly to CAM after the second burst search command is issued to the CAM. As the data from the second burst search command is being written to the "write" memory, it is written in parallel at the same address in the CAM. After the result of the second burst search command for the sort cycle is written to CAM, the result of the first burst search operation for the sort cycle stored in the write memory is written to CAM starting at address 0 in the CAM.

The invention has been described for a series of masked one bit burst searches. In another embodiment, masked burst searches can be performed on M-bits. At each sort cycle, 2M searches are performed to cover all possible states. For example, with M=1, 21 searches are performed one for each of the two possible states '1' and '0'. With M=2, 22 (4) searches are performed in each sort cycle, one for each of the four possible states '00', '01', '10', '11'. If P is the precision of the key, P/2 sort cycles are required and with 2-bits per sort cycle, each sort cycle requires 4 searches. Thus, (P/M)*2M searches are required to complete the sort. The entries are sorted two bits at a time by issuing a burst search command for '00', followed by a burst search for '01', burst search for '10' and finally a burst search for '11', with sorted entries written back to the CAM after the last of the four masked two bit burst search commands has been issued to the CAM.

Figure 2:
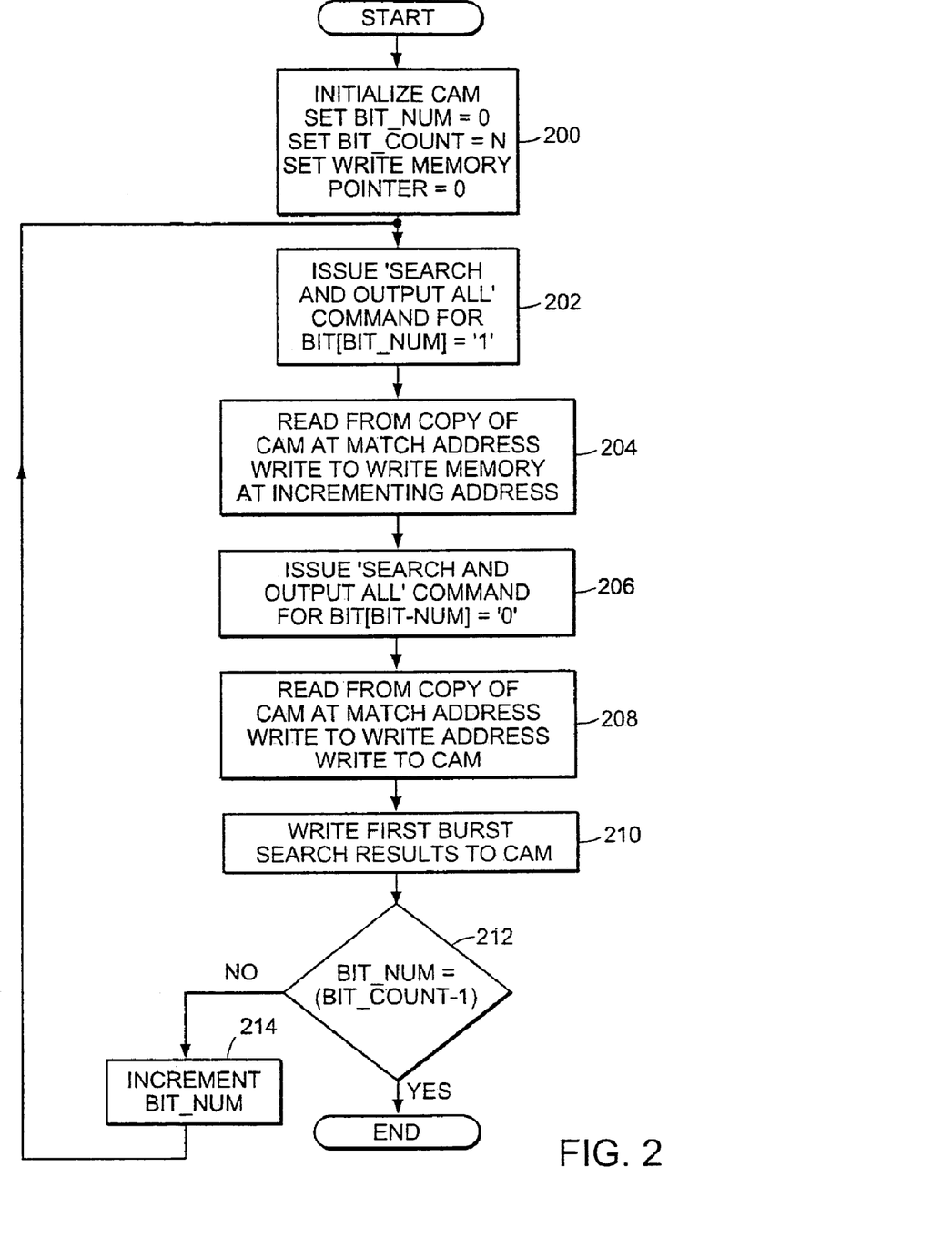
FIG. 2 is a flow diagram illustrating the method for sorting entries stored in the sorting apparatus shown in FIG. 1.

FIG. 2 is a flow diagram illustrating a method for sorting entries stored in the sorting apparatus 150 shown in FIG. 1. The method is described in conjunction with FIG. 1. A sort algorithm is stored in instruction memory 112 and executed by the processor 110. The sort algorithm performs a bit by bit search of entries in the CAM. At the start of each sort cycle, the memory storing the contents of the CAM is selected as 'read' memory and the other memory is selected as 'write' memory. The memories are switched in roles at the end of each sort cycle. Two pointers are allocated in the instruction memory 112 one for storing the next read memory pointer (address), the other for storing the next write memory pointer (address).

At the start of each sort cycle, the write memory pointer is initialized to zero. Two burst search commands are issued to the CAM during each sort cycle. The data items stored in the CAM can be sorted in ascending or descending order. To sort in ascending order, the first burst search command in each sort cycle is issued for the selected bit set to '0' and the second burst search command is issued for the selected bit set to '1'. To sort in descending order, the first burst search command is issued for the selected bit set to '1' and the second burst search command is issued for the selected bit set to '0'. A method for sorting the data items in descending order is described later in conjunction with FIG. 4. In the embodiment shown, the data items are sorted ascending order.

At step 200, the CAM is initialized by issuing a reset to the CAM, configuring the CAM, clearing memory and then writing the data items to be sorted to the CAM. A copy of the CAM contents is then written to the designated "read" memory for the first sort cycle. A bit_num variable representing the current bit number to be sorted is initialized to zero. A variable representing the total number of bits in each data item to be searched is initialized. Processing continues with step 202.

At step 202, at the start of a sort cycle, a first burst masked bit search command is issued to the CAM. A "search and output all" instruction is issued through the instruction inputs of the CAM and a search key with the current bit in the search key set to '1' and all other bits in the search key masked is input through the SDQ inputs of the CAM. Processing continues with step 204. At step 204, all of the match addresses resulting from the burst masked bit search for the current bit set to '1' are output from the CAM on the match address outputs and forwarded to the 'read' memory 102 through multiplexor 116. The data associated with the match addresses is read from the "read" memory 102. Data read from the "read" memory at each match address is written in order to the write memory 104 at incrementing addresses starting at address '0'. Processing continues with step 206.

At step 206, after data has been written to the "write" memory 104 based on the result of the first burst search, a second burst search is issued to the CAM by issuing a "search and output all" instruction with the current bit in the search key set to '0' and all other bits masked. Processing continues with step 208.

At step 208, the data stored in the "read" memory 102 is read at the match addresses output in response to the second masked burst search. The entries read from the 'read' memory 102 are written in order to the write memory at the next available address. As the entries are written to the 'write' memory 104, they are also written to the CAM, starting at the address after the last write to the "write" memory for the first burst search. Processing continues with step 210.

At step 210, after the entries matching the second burst search are written to 'write' memory 104, the write address register is reset to zero. The entries matching the first burst search are written in order to the CAM. Processing continues with step 212.

At step 212, after the sort cycle is complete, the number of bits sorted (BIT_NUM) is checked to determine if all required bits have been sorted. If so, processing is complete. If not, processing continues with step 214.

At step 214, the number of bits sorted (BIT_NUM) is incremented. Processing continues with step 202 to perform a sort cycle for the next bit.

The time required to complete all the operations for each bit sort operation is approximately equal to the time to write the entire contents of the CAM. When using the DC9288 CAM, the time can be minimized by configuring the CAM in 72 bit I/O mode with double data rate mode. With double data rate mode, an update of one location in the CAM takes one CAM write cycle. To further decrease the time for updating the CAM, the read and write memory can perform 144-bit read and write operations and multiple memory devices can be used in parallel.

In the embodiment described above, the average number of cycles for bit-by-bit sorting of entries using a CAM is 3/2× P×N where P is the precision of the data items to sort, (the number of bits in each data item to be sorted) and N is the number of data items to sort. The factor of 3/2 is related to the delay in writing the results of the burst search command back to the CAM until after the second burst search command has been issued to the CAM. Thus, the invention provides a deterministic search time which is dependent on the number of entries and the number of bits in each entry to be sorted.

The sorting time is independent of the distribution of the values to be sorted. For example, if the CAM stores 64K 144-bit entries, the bit-by-bit sort operation takes 14.2 million cycles (3/2×65536×144) to sort 144 bits. For a CAM operating at 100 Mhz, the sort operation takes 142 ms.

In one embodiment, the sorting method is used in Classless Inter-domain routing to re-order the contents of a CAM in longest prefix match order. For an IPv4 address with 32-bits, 5 tag bits in a prefix identify the mask length of each IP routing entry. The routing entries are sorted on the five bits of the prefix. Thus, with 64K routing entries, at 100 MHz per CAM cycle the sort time is 4.9 ms (3/2×65536×5). For an IPv6 address with 128-bits, 7 tag bits identify the mask length of each IP routing entry. 64K IPV6 routing entries can be sorted in 6.9 ms (3/2×65536×7) based on the 7 tag bits. Sorting can be performed at each update or the updates can be grouped allowing one sorting operation for multiple updates.

Figure 3:
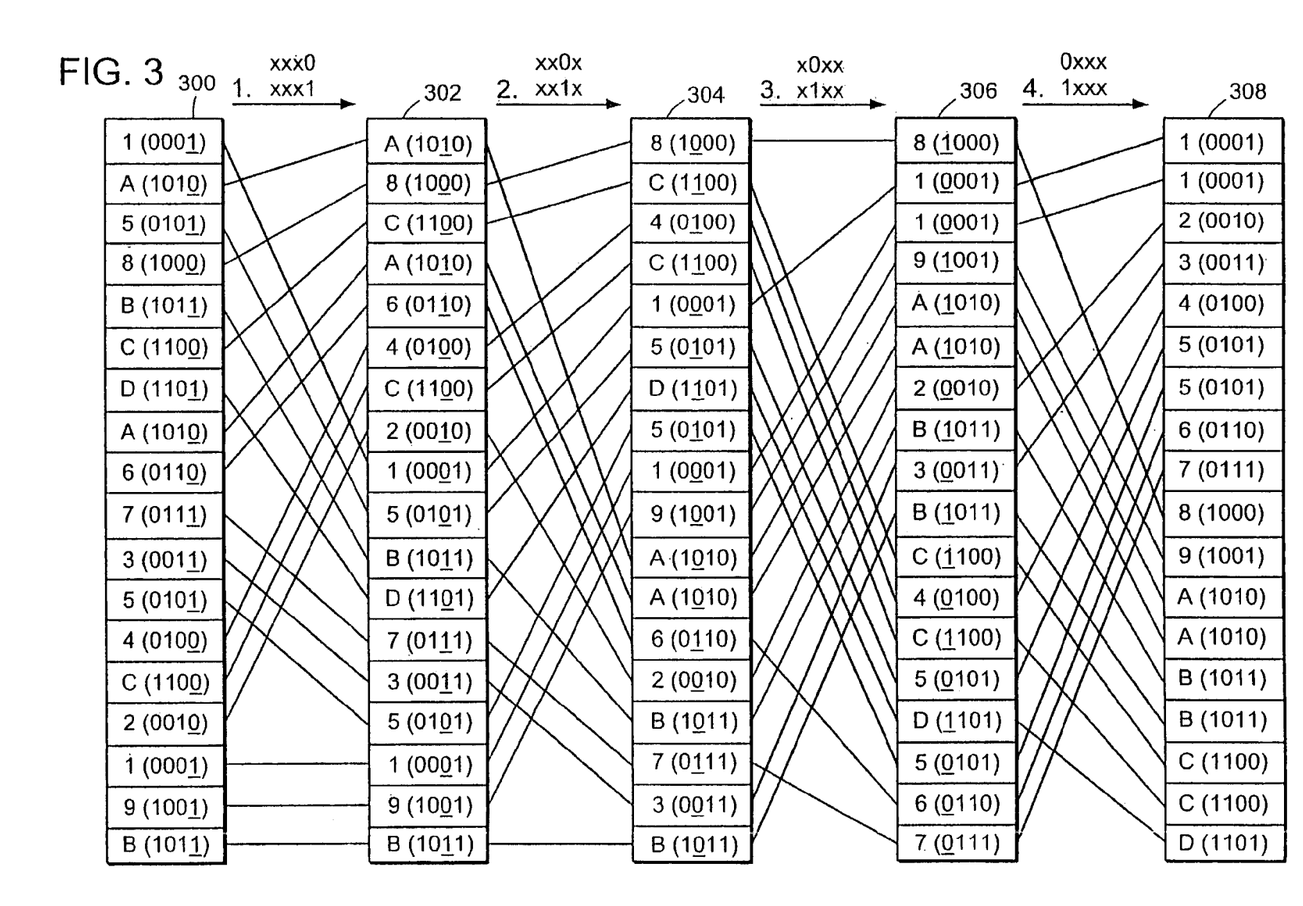
FIG. 3 illustrates a non-progressive sort in ascending order of a plurality of 4-bit values stored in the Content Addressable Memory shown in FIG. 1.

FIG. 3 illustrates a non-progressive sort in ascending order of a plurality of 4-bit data items stored in the CAM 100 shown in FIG. 1. The sort in ascending order is performed by performing a sort cycle as described in conjunction with FIG. 2 for each bit from the least significant bit (LSB) to the most significant bit (MSB). During each sort cycle, two masked one bit burst search commands are issued to the CAM. The first masked one bit burst search command is issued to search for data items having the selected bit set to '0' (i.e. A, 8, C, A, 6, 4, C, 2) and all of the other bits masked. The second masked one burst search command is issued to search for data items having the selected bit set to '1' and all of the other bits masked. Four sort cycles are performed, one for each of the 4-bits to be sorted in the data items shown in FIG. 3.

FIG. 3 is described in conjunction with FIG. 1. As shown in FIG. 3, before the first burst search, a list of data items in random-order 300 is stored in the CAM 100 and copied to the first memory 102. The hexadecimal representation of each data item in the list in random-order 300 is shown followed by the binary representation in parenthesis. For the first sort cycle, the first memory 102 is designated "read" memory and the second memory 104 is designated "write" memory. A non-progressive sort is performed by first sorting the data items based on the value of the least significant bit. The first burst search command is issued to the CAM 100 for data items having the least significant bit (bit 0) set to '0'. The match addresses for all data items having bit 0 set to '0' are output. For each match address that is output, a read is performed at the match address in the first memory 102. The data items read from memory 102 at the match addresses are written to memory 104 in order at incrementing addresses starting with address '0'.

After the first burst search in the CAM, the data items written to the first re-ordered list of entries 302 stored in the second memory 104 all have the least significant bit set to '0'. After the first burst search is performed, a second burst search for all data items having the least significant bit (bit 0) set to '1' is performed. The match addresses of the matching entries are output. For each match address output by the CAM, the data item stored at the match address in the first memory 102 is written to the second memory 104 at the next address after the last address written in the first burst search. After the second burst search, the first re-ordered list of entries 302 stored in the second memory 104 stores all entries in ascending order according to the least significant bit.

The first re-ordered list of entries 302 stored in the second memory 104 is copied to the CAM 100 as already described in conjunction with FIG. 2. The second memory 104 stores the copy of the CAM for the next sort cycle. The memories are switched in roles, the first memory 102 becomes "write" memory (for writing the next re-ordered list), and the second memory 104 becomes "read" memory (storing a copy of the CAM).

In the next sort cycle, a second masked one bit burst search command is issued to the CAM for entries having bit 1 set to '0' and all other bits masked. The match addresses for all values having bit 1 set to '0' (i.e. 8, C, 4, C, 1, 5, D, 5, 1, 9) are output. For each match address, the data item read from the second memory 104 storing a copy of the CAM is written to the first memory 102 at incrementing addresses starting at 0.

After the data items are written to the first memory, the first data items in the second re-ordered list of entries 304 all have bit 1 set to '0'. After the first burst search is performed, a second burst search command for all the data items having bit 1 set to '1' and all other bits masked is issued to the CAM. The match addresses of the matching entries are output. For each match address output by the CAM, the data item read from the second memory 104 at the match address is written to the first memory 102 at incrementing addresses starting after the last address written in the first burst search. After the second burst search, the second re-ordered list of entries 304 stored in the first memory 102 stores all entries in ascending order according to the values of bits 0 and 1.

The second re-ordered list of entries 304 stored in the first memory 102 is copied to the CAM 100 and the first memory 102 stores the copy of the CAM for the next sort cycle. The memories are switched in roles, the first memory 102 becomes "read" memory (storing a copy of the CAM), and the second memory 104 becomes "write" memory (for writing the next re-ordered list).

The first search in the next sort cycle is performed in the CAM storing second re-ordered list 302 for data items having bit 2 set to '0' and all other bits masked. The match addresses for all data items having bit 2 set to '0' are output. For each match address that is output, a read is performed in the first memory 102 that stores a copy of the CAM. The read data items are written to the second memory 104 at incrementing addresses starting at 0.

The first data items in the third re-ordered list of entries 306 stored in the first memory 102 after the first burst search is performed all have bit 2 set to '0'. After the first burst search is performed, a second burst search for all the values that have bit 2 set to '1' and all other bits masked is performed in the CAM. The match addresses of the matching entries are output. For each match address output by the CAM, a read is performed in the first memory 102 at each match address and a write of the data read from the first memory 102 is performed in the second memory 104 at an incrementing address starting after the last address written in the first burst search. After the second burst search, the third re-ordered list of entries 306 stored in the first memory 102 stores all entries in ascending order according to the values of bits 2:0.

The third re-ordered list of entries 306 stored in the second memory 104 is copied to the CAM 100. The second memory 104 stores the copy of the CAM for the next sort cycle. The memories are switched in roles, the second memory 104 becomes "read" memory (storing a copy of the CAM), and the first memory 102 becomes "write" memory (for writing the next re-ordered list).

The first search in the next sort cycle is performed in the CAM for data items having bit 3 set to '0' and all other bits masked. The match addresses for all data items having bit 3 set to '0' are output. For each match address that is output, a read is performed at the respective match address in the second memory 104 that stores a copy of the CAM. The read values are written to the first memory 102 at incrementing addresses starting at '0'.

The first data items in the fourth re-ordered list of entries 308 stored in the first memory 102 after the first burst search is performed all have bit 3 set to '0'. After the first burst search is performed in the CAM, a second burst search for all the data items having bit 3 set to '1' and all other bits masked is performed in the CAM. The match addresses of the matching entries are output. For each match address output by the CAM, a read is performed in the second memory 104 at the respective match address and a write of the data item read from the second memory 104 is performed in the first memory 102 at an incrementing address starting after the last address written in the first burst search. After the second burst search, the fourth re-ordered list of entries 308 stored in the first memory 102 stores all entries in ascending order according to the values of bits 3:0.

The fourth re-ordered list of entries 304 stored in the first memory 102 is copied back to the CAM 100. The entries in the CAM are now ordered in ascending order after four sort cycles. Each sort cycle sorts one bit. Thus, a sort of precision P requires P sort cycles.

The contents of the CAM cannot be updated with the result of the searches until all searches have been completed. For example, if the ordered entries are '10', '11', '01', '00', a search for LSB='0', results in two entries '10', '00' which if written directly back to CAM in order would result in overwriting the second entry storing '11'. However, as soon as the second burst search command has been issued to the CAM, updates of the CAM can be started without affecting the search results. Thus, the match address outputs, read/write operations to memories 102, 104 and updates of the CAM are performed in parallel based on the match addresses output as a result of the second burst search command, after the search burst search command has been issued.

Figure 4:
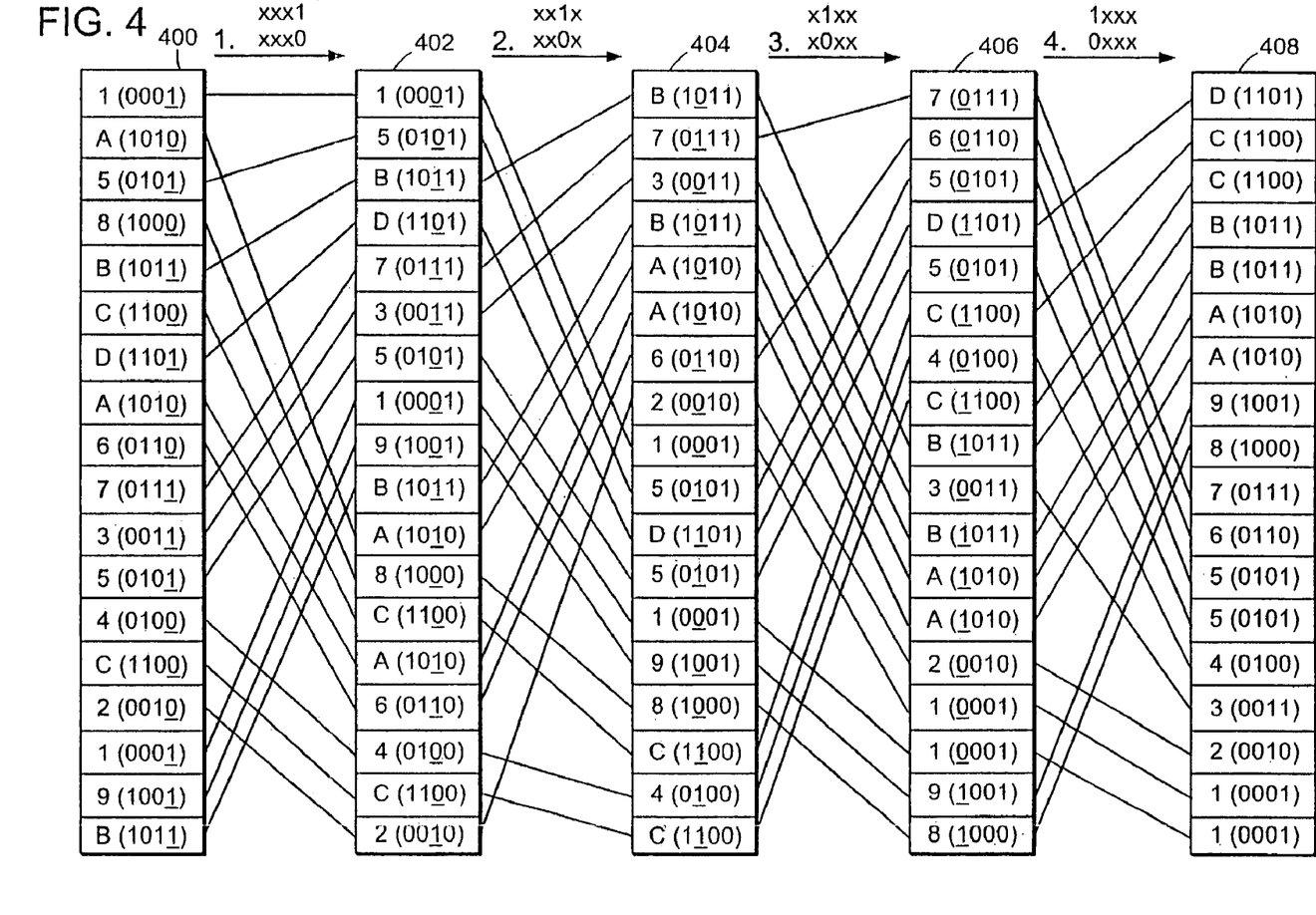
FIG. 4 illustrates a non-progressive sort in descending order of a plurality of 4-bit values stored in the Content Addressable Memory shown in FIG. 1.

FIG. 4 illustrates a non-progressive sort in descending order of a plurality of 4-bit data items stored in the Content Addressable Memory shown in FIG. 1. Operations for sorting in a descending order are similar to those discussed in conjunction with FIG. 3 for sorting in an ascending order. However, the order of the searching is reversed in each sort cycle. Instead of performing a burst search for a selected bit set to '0' followed by a burst search for the selected bit set to '1', the first burst search in each sort cycle is performed for the selected bit set to '1' followed by a burst search for the selected bit set to '0'. The contents of the CAM after each sort cycle differs when sorting in descending order instead of ascending order. However, the two methods are equivalent in complexity. Both require the same number of burst search commands to be issued and same number of writes to the CAM 100.

The non-progressive sort in descending order is performed by performing a sort cycle as described in conjunction with FIG. 2 for each bit to be sorted, from the least significant bit (LSB) to the most significant bits (MSB). Four sort cycles are performed for the 4-bit entries shown in FIG. 4.

As shown in FIG. 4, before the first sort cycle (bit 0), a list of entries in random-order 400 is stored in the CAM 100. In the first sort cycle, a first burst search command is issued to the CAM for data items having the least significant bit (bit 0) set to '1' and all other bits masked. A second burst search command is issued to the CAM for data items having the least significant bit (bit 0) set to '0' and all other bits masked. The first re-ordered list 402 of data items is copied to the CAM. The first re-ordered list 402 stores all entries in descending order according to the values of the least significant bit (bit 0).

A first burst search in the next sort cycle (bit 0) is performed in the CAM for entries having bit 1 set to '1' and all other bits masked. A second burst search is performed in the CAM for entries having bit 1 set to '0' and all other bits masked. The result of the searches are stored in the second re-ordered list of entries 404 which is written to CAM. The second re-ordered list of entries stores all entries in descending order according to the values of bits 1 and 0.

A first burst search in the next sort cycle (bit 2) is performed in the CAM for data items having bit 2 set to '1' and all other bits masked. A second burst search for all the data items that have bit 2 set to '0' is performed in the CAM and all other bits masked. After the second burst search, the third re-ordered list of entries 406 stored in the CAM stores all entries in descending order according to the values of bits 2:0.

The first search in the next sort cycle is performed in the CAM for entries having the Most Significant Bit (bit 3) set to '1' and all other bits masked. After the first burst search is performed, a second burst search for all the entries that have bit 3 set to '0' and all other bits masked is performed in the CAM. After the two burst searches, the fourth re-ordered list of entries 408 stores the entries in descending order. The fourth re-ordered list of entries 408 is written to the CAM.

The invention has been described for an embodiment with two random access memories and a CAM. In an alternate embodiment, one of the random access memories can be replaced by a CAM. For example, prior to the first burst search cycle, the contents of the first CAM are duplicated in RAM. The results of the burst search in the first CAM are written to the second CAM using the match addresses and the data associated with the match addresses stored in RAM. After the first burst search cycle is complete, the content of the second CAM are duplicated in RAM. The next burst search command is issued to the second CAM. The burst search commands are issued to alternate CAMs until the contents have been sorted.

Figure 5:
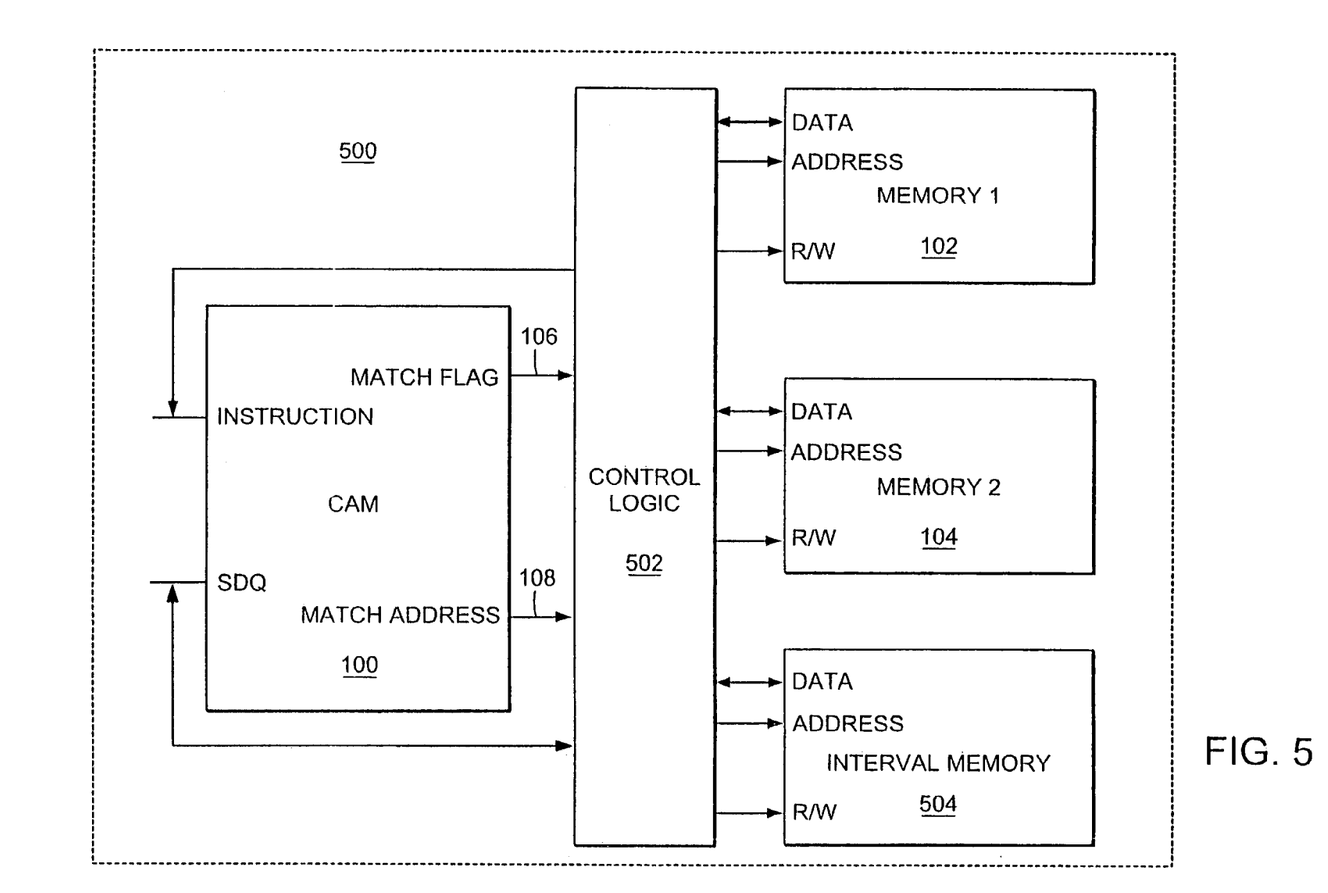
FIG. 5 is a block diagram of another embodiment of the sorting apparatus.

FIG. 5 is a block diagram of another embodiment of the sorting apparatus 500. The embodiment of the sorting apparatus shown in FIG. 5 performs a progressive sort. A progressive sort performs a bit-by-bit sort starting with the most significant bit (MSB) and ending with the least significant bit (LSB). The sorting apparatus 500 includes a Content Addressable Memory (CAM) 100, two read/write memories 102, 104 and interval memory 504. The CAM and read/write memories 102, 104 have already been described in conjunction with the embodiment of the sorting apparatus for performing a non-progressive sort shown in FIG. 1.

The progressive sort must keep track of boundaries that separate the results of searches for a bit set to '0' and a bit set to '1'. The boundaries provide sorting intervals. The progressive sort ensures that during further sort operations, the data stored in a sorting interval does not cross the boundaries. For example, when sorting 2-bit entries '10', '01', '11', '00' in ascending order starting at the MSB=0, the first sort cycle results in '01', '00', '01', '11' with a boundary between '00' and '10' defining two sorting intervals one interval storing entries having MSB=0, ('01, '00'), the other interval storing entries having MSB='1' ('10', '11'). The next sort cycle sorts sorting interval storing '01', '00' based on the least significant bit resulting in '00', '01'.The final sorted result in ascending order is '00', '01', '10', '11'. The order of entries in an interval may change during each burst search cycle but the entries are not moved outside the interval defined by the boundaries.

The progressive sorting approach is suited for very long list sorting on parallel systems, because the sorting process in each intermediate interval of a given sort cycle is independent of the sorting process in the other intervals of the same sort cycle. Thus, at a given sort cycle, the sorting in the different intervals (between boundaries) can be performed independently by different tasks, with each task assigned to a different sorting apparatus 500. Each interval (sub-list) is sorted on a different sorting apparatus 500. Once each task is finished, the results are combined and concatenated in the same order as they were assigned without any additional processing.

The CAM read/write memories and interval memory are coupled to control logic 502. The control logic 502 controls read and write access to the memories. The control logic 504 assigns one of read/write memories 102, 104 as "read" memory. "Read" memory stores a current copy of the contents of the CAM. The control logic 502 assigns the other read/write memory 102, 104 as "write" memory. Search results are written to 'write' memory by copying the data from the read memory using match addresses output by the CAM. The control logic 502 also controls access to the interval memory 504. The control logic 502 issues burst search commands dependent on the stored interval boundaries. The control logic 502 also issues write commands to the CAM 602.

After each burst search command is complete, the control logic 502 saves interval boundaries by writing them to interval memory 504. By saving interval boundaries, the control logic 502 ensures that the data items to be sorted are not moved across interval boundaries.

The control logic 502 is coupled to the CAM 100 for receiving match addresses output by the CAM in response to a burst search command. For each match address output by the CAM, the control logic 502 performs a read of the read/write memory designated as "read memory" for the current sort cycle to retrieve the copy of the CAM entry stored at the match address 108. The control logic reads the interval boundaries stored in the interval memory 604 and compares the match address to the interval boundaries. The read data is written to an address in the "write" memory.

Figure 6:
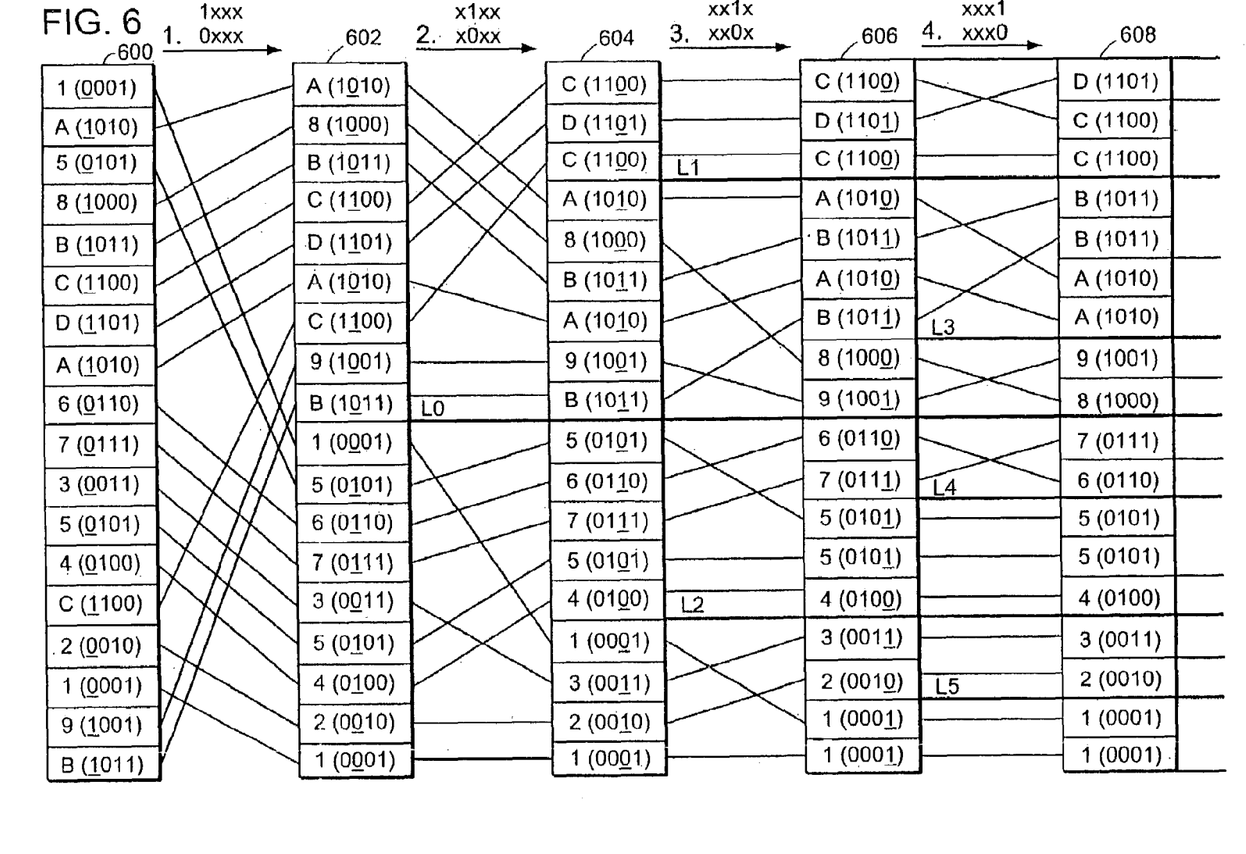
FIG. 6 illustrates a progressive sort in descending order of a plurality of 4-bit values stored in the Content Addressable Memory shown in FIG. 1.

FIG. 6 illustrates a progressive sort in descending order of a plurality of 4-bit data items stored in the Content Addressable Memory shown in FIG. 5.

The list of entries (data items) in random order 600 is stored in the CAM and copied to the first memory which is designated "read" memory. To sort in descending order, a burst search command is issued to the CAM with the MSB of the search key set to '1' and all the other bits masked (i.e. a burst search for '1xxx'.) The matching addresses are output in a burst. The data stored at the match addresses in the "read" memory is written to the "write" memory in the order shown in the first ordered list 602. After all of the matching entries for the burst search for '1xxx' are written to "write" memory, the address in write memory at which the writes stopped is stored as interval limit L0 in the interval memory. As shown, the first entries in the first ordered list 602 above interval limit L0 have the most significant bit set to '1'.

A second burst search is issued to the CAM with the MSB of the search key set to '0' and all other bits masked (i.e. a burst search for '0xxx'.). The matching addresses are output in a burst and written to the "write memory" in first order 602. The first write address in 'write' memory is the address after interval limit L0.

The contents of the 'write' memory in order 602 is written back to the CAM in order 602. The roles of the external memories are swapped. The memory that was designated "write" memory in the previous two burst searches for the MSB is designated 'read' memory. The "read" memory stores a copy of the contents of the CAM. The other memory is designated 'write' memory. During writes, the entries are not allowed to cross boundaries defined by interval limits.

In the next sort cycle, the entries in order 602 are reordered to order 604. A burst search command is issued with search key of 'x1xx' followed by another burst search command with a search key of 'x0xx'.

The first burst search of CAM storing entries in order 602 is performed with search key of 'x1xx'.The first match entry is 'C', the match address is less than interval L0 and the entry is written to the first address in 'write' memory storing values in order 604. The next match entry stored in CAM in order 602 is 'D', the match address is less than interval L0 and is written to the next address in 'write' memory storing values in order 604. The next match entry stored in CAM in order 602 is 'C', the match address for entry 'C' is less than interval limit L0 and entry 'C' is written in the next location in 'write' memory storing entries in order 604. The next match entry is '5', the match address is greater than the match address for match entry '5', match entry '5' is written at the write address after interval limit L0. A new limit interval L1 is stored in interval memory. All further matches for 'x1xx' are stored in addresses in 'write' memory above interval limit L0. At the end of the burst search for 'x1xx', interval limit L1 is stored in interval memory.

The results of burst search 'x0xx' are written in order 604 above interval L1 for match addresses less than interval limit L0 and above interval limit L2 for match addresses greater than interval limit L0.

After the burst search for x1xx there are three interval limits L1, L0, L2. The entries above L1 and the entries between L0 and L2 are written to "write" memory. The burst search for x0xx and the write back to CAM are performed in parallel with the ordered entries from L1 to L0 written back first, followed by the ordered entries from below L2.

The ordered entries stored in "write" memory are then written back to CAM. The ordered entries above L1 are written back first using write to next free address instruction. The write to next free address instruction writes entries in order starting at the lowest free address. Finally, the ordered entries between L0 and L2 are written back to the CAM using write to next free address instructions starting with the entry at the address below L0. The CAM then stores the entries in the same order as the write memory i.e., order 604.

During the first burst search cycle, one boundary is created requiring one interval limit (i.e. interval limit L0) to be stored. A boundary may be created in each interval in each additional search cycle. Entries in an interval are not allowed to cross boundaries during writes to the 'write' memory.

As shown, the '1xxx' and '0xxx' burst searches create one boundary and interval limit L0 is stored in interval memory. Burst searches 'x1xx' and 'x0xx' in CAM with entries stored in order 602 create four boundaries and new interval limits L1 and L2 are stored in interval memory. Burst searches 'xx1x' and 'xx0x' in CAM with entries stored in order 604 create six boundaries and new interval limits L3, L4, L5.

The order of entries in an interval may change during each burst search cycle but the entries are not moved outside the interval defined by the interval limits. In the worst case, in each burst search cycle, each interval can be divided into two intervals. Thus, at step M, where M is less than the precision P of the values the number of intervals is 2M.

After four sort cycles, the entries are ordered in descending order 608. The descending order is a direct result of the order in which the burst searches are performed in each sort cycle. By searching for a bit set to '1' first then for the bit set to '0', the entries are sorted in descending order. Sorting in ascending order is performed by inverting the order of burst searches. By searching for a bit set to '0' first then for the bit set to '1', the entries are sorted in ascending order.

For each newly formed interval defined by interval limits, the entries in the interval remain in the interval in the final ascending or descending order. For example, the entries above interval limit L0 in order 602 are also above interval limit L0 in the final descending order 608. Also, entries between interval limits L1 and L3 in entry order 606 are also between interval limits L1 and L3 in the final descending order 608.

The sorted entries in 'write' memory are written back to the CAM in the same order in which they are written in the CAM. The entries are written back to CAM after the second burst search command is issued to the CAM. Thus, reads from the 'read' memory writes the 'write' memory and writes to the CAM are performed in parallel.

For example, the values in order 602 for the burst search for '1xxx' are written back to CAM starting with addresses below interval limit L0 using a write to memory using an address register with automatic increment. The values in order 602 that matched on a burst search for '1xxx' are written using a write to next free address instruction as they are read from the second memory.

Figure 7:
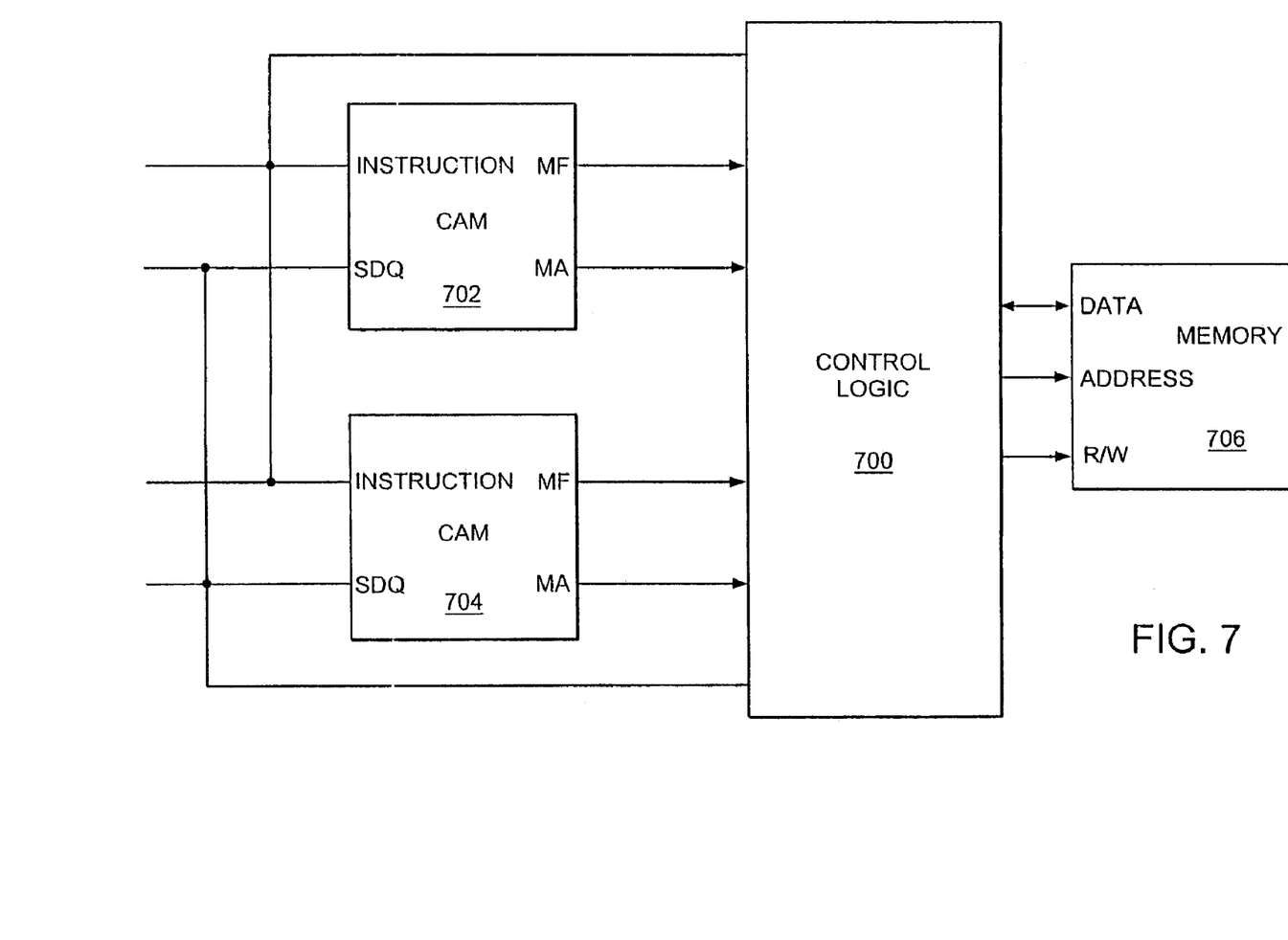
FIG. 7 is a block diagram of yet another embodiment of the sorting apparatus.

FIG. 7 is a block diagram of yet another embodiment of the sorting apparatus. The sorting apparatus includes two CAMs 702, 704 and a memory 706 coupled to control logic 700. The entries to be sorted are stored in one of the CAMs 702, 704 and copied to the memory 706. The sort begins by issuing a burst search command to the CAM storing the entries to be sorted. For example, if CAM 702 stores the entries to be sorted, the first burst search command is issued to CAM 702. The control logic 700 uses the match addresses output by CAM 702 in response to the burst search command to read the entries stored at the corresponding addresses in memory 706 and write the entries in order in CAM 704. After the burst sort cycle is complete and all entries have been written to CAM 704, the contents of CAM 704 are written to memory 706. The next sort cycle issues a burst search command to CAM 704 and the results of the sort cycle are written to CAM 702 using the copy of CAM 704 stored in memory 706. Each subsequent sort cycle alternates between the CAMs 702, 704, with the burst search issued to one of the CAMs and the results of the sort written to the other CAM.

While this invention has been particularly shown and described with references to preferred embodiments thereof, it will be understood by those skilled in the art that various changes in form and details may be made therein without departing from the scope of the invention encompassed by the appended claims.

What is claimed is:

1. A sorting apparatus to sort data, comprising:
   a first memory that: 1) stores data to be sorted; 2) receives a search command to sort the stored data; and 3) outputs a match address in response to the search command;
   a second memory capable of being either read or write memory;
   a third memory capable of being either read or write memory;
   a controller that: i) stores the data to be sorted in the first memory and one of the second memory or third memory; ii) issues the search command; and iii) controls whether each of the second memory and the third memory is read or write memory;
   one of the second memory or third memory, in a read mode, having a copy of the data to be sorted, and the memory in read mode providing match data in response to the match address from the first memory; and
   one of the second memory or third memory, in a write mode, storing the match data from the memory in read mode.

2. The sorting apparatus as claimed in claim 1 wherein the controller further causes the sorted data to be written back to the first memory from the one of the second memory or third memory in write mode to allow issuance of an additional search command on the sorted data.

3. The sorting apparatus as claimed in claim 1 wherein the search command is a masked M-bit search.

4. The sorting apparatus as claimed in claim 1 wherein the first memory is Content Addressable Memory (CAM).

5. The sorting apparatus as claimed in claim 1 wherein the controller controls the match address of the first memory and selects whether each of the second and third memory is in read or write mode using multiplexers.

6. The sorting apparatus as claimed in claim 1 wherein the second memory and third memory alternate between write and read memory on successive sort cycles.

7. The sorting apparatus as claimed in claim 1 wherein the second and third memories are random access memories.

8. The sorting apparatus as claimed in claim 1 wherein the sorted data is in ascending or descending order.

9. A method for sorting data, comprising:
   storing data in a first memory;
   storing a copy of the data to be sorted in a second memory;
   identifying the second memory as read memory and a third memory as write memory, the second and third memories being capable of being either read or write memories;
   receiving a search command, in the first memory, for sorting the data;
   in response to the search command, outputting a match address to the second memory;
   sending match data corresponding to each match address for the second memory to the third memory; and
   storing the match data in the third memory.

10. The method as claimed in claim 9 further comprising: writing the sorted data back to the first memory from the third memory to provide additional searching of the sorted data.

11. The method as claimed in claim 9 wherein the search command is a masked M-bit search.

12. The method as claimed in claim 9 wherein the first memory is a Content Addressable Memory (CAM).

13. The method as claimed in claim 9 further comprising: selecting whether each of the second and third memory is in read or write mode using multiplexers.

14. The method as claimed in claim 9 further comprising: alternating the second memory and the third memory between write and read memory on successive sort cycles.

15. The method as claimed in claim 9 wherein the second and third memories are random access memories.

16. The method as claimed in claim 9 wherein the sorted data is in ascending or descending order.

* * * * *